(12) United States Patent
Ordentlich et al.

(10) Patent No.: US 9,015,405 B2
(45) Date of Patent: Apr. 21, 2015

(54) METHOD AND SYSTEM FOR ENCODING DATA FOR STORAGE IN A MEMORY ARRAY

(75) Inventors: Erik Ordentlich, San Jose, CA (US); Ron M. Roth, Haifa (IL); Gadiel Seroussi, Cupertino, CA (US); Pascal Vontobel, Palo Alto, CA (US)

(73) Assignee: Hewlett-Packard Development Company, L.P., Houston, TN (US)

( * ) Notice: Subject to any disclaimer, the term of this patent is extended or adjusted under 35 U.S.C. 154(b) by 319 days.

(21) Appl. No.: 13/805,169

(22) PCT Filed: Jun. 29, 2010

(86) PCT No.: PCT/US2010/040321
§ 371 (c)(1),
(2), (4) Date: Dec. 18, 2012

(87) PCT Pub. No.: WO2012/002931
PCT Pub. Date: Jan. 5, 2012

(65) Prior Publication Data
US 2013/0097396 A1 Apr. 18, 2013

(51) Int. Cl.
*G06F 12/00* (2006.01)
*G06F 13/00* (2006.01)
*G06F 13/28* (2006.01)
*G11C 11/24* (2006.01)
*G11C 7/00* (2006.01)
*G11C 7/10* (2006.01)
*G11C 13/00* (2006.01)
*G11C 16/08* (2006.01)
*G11C 11/16* (2006.01)
(Continued)

(52) U.S. Cl.
CPC .......... *G06F 12/00* (2013.01); *G11C 11/16* (2013.01); *G06F 11/1008* (2013.01); *G11C 7/1006* (2013.01); *G11C 13/0007* (2013.01); *G11C 16/08* (2013.01); *G11C 16/3418* (2013.01); *G11C 2213/71* (2013.01)

(58) Field of Classification Search
CPC ............................. G11C 11/16; G06F 11/1008
USPC .................................. 711/103; 365/148, 221
See application file for complete search history.

(56) References Cited

U.S. PATENT DOCUMENTS 5,579,475 A    11/1996  Blaum et al.
6,175,317 B1    1/2001  Ordentlich et al.
7,859,884 B2 *  12/2010  Scheuerlein ............... 365/148
(Continued)

OTHER PUBLICATIONS

Etzion T. et al, "Zero/positive capacities of two-dimensional runlength-constrained arrays", Information Theory, IEEE Transactions on 51, No. 9 (2005): 3186-3199.

(Continued)

*Primary Examiner* — Ryan Bertram
(74) *Attorney, Agent, or Firm* — Hewlett-Packard Patent Department

(57) ABSTRACT

A method of storing data into a memory array converts an input string into a first binary array with (m−1) rows and (n−1) columns. A second binary array with m rows and n columns in an encoded bit pattern is then generated from the first binary array. The second binary array in the encoded bit pattern has at most n/2 1's in each row and at most m/2 1's in each column, and the m-th row and an n-th column contain information for decoding other entries of the second binary array. The encoded bit pattern of the second binary array is then stored into corresponding memory devices of the memory array.

15 Claims, 5 Drawing Sheets

(51) Int. Cl.
*G06F 11/10* (2006.01)
*G11C 16/34* (2006.01)

(56) References Cited

U.S. PATENT DOCUMENTS

| | | |
|---|---|---|
| 7,885,094 B2 * | 2/2011 | Min et al. .................. 365/158 |
| 2008/0049481 A1 | 2/2008 | Hanzaiva et al. |
| 2008/0089110 A1 | 4/2008 | Robinett et al. |
| 2008/0266941 A1 | 10/2008 | Lee et al. |
| 2009/0003040 A1 | 1/2009 | Stan et al. |
| 2010/0034015 A1 * | 2/2010 | Tsuji .......................... 365/158 |
| 2013/0262759 A1 * | 10/2013 | Ordentlich et al. .......... 711/114 |

OTHER PUBLICATIONS

Roth, Ronald M., et al. "Efficient coding for a two-dimensional runlength-limited constraint." In Proc. of the SPIE—The Intl. Soc. for Optical Engineering, vol. 3802, pp. 8-17. 1999.

The International Search Report and the Written Opinion of the International Searching Authority; dated Mar. 25, 2011; Application PCT/US2010/040321; Filed Jun. 29, 2010.

* cited by examiner

METHOD AND SYSTEM FOR ENCODING DATA FOR STORAGE IN A MEMORY ARRAY

CROSS-REFERENCE TO RELATED APPLICATION

This application is a U.S. National Stage Application of and claims priority to International Patent Application No. PCT/US2010/040321, filed on Jun. 29, 2010, and entitled "METHOD AND SYSTEM FOR ENCODING DATA FOR STORAGE IN A MEMORY ARRAY."

BACKGROUND

Solid state storage systems with no moving parts and allowing for random access are becoming increasingly attractive, given their inherent ruggedness and low or zero idling power requirements. One especially interesting type of memory device is based on the recently discovered resistive switching devices that have been shown to exhibit a memristive behavior. A resistive switching device can be programmed to be in an ON state with a low resistance or an OFF state with a high resistance. Such resistive switching devices can be used as non-volatile memory cells and can be fabricated in a nanoscale two-dimensional crossbar structure with a very high cell density.

One of the main challenges in developing high density memories based on crossbars of resistive switching devices is the half-select problem, in which devices that are not addressed may still draw significant current. In a crossbar array, there can be many resistive switching devices on each column or row wire. To program or read the value of a resistive switching device, a corresponding write or read voltage is applied to that device through the column and row wires of the selected device. The other switching devices connected to the same column or row wire of the selected device, however, are "half-selected" because they also experience significant voltage drops across their terminals. Those half-selected devices that are in the ON (or low resistance) state will contribute to a significant cumulative current draw. The current draw caused by those-half selected switching devices, which is parasitic in nature, not only leads to wasted power but also negatively impacts the read sensitivity in terms of the on/off current ratio used to determine the state of the selected device. Moreover, such high parasitic current can reduce the longevity of the circuit through heat dissipation, electro-migration, etc.

BRIEF DESCRIPTION OF THE DRAWINGS

Some embodiments of the invention are described, by way of example, with respect to the following figures.

DETAILED DESCRIPTION

Figure 1:
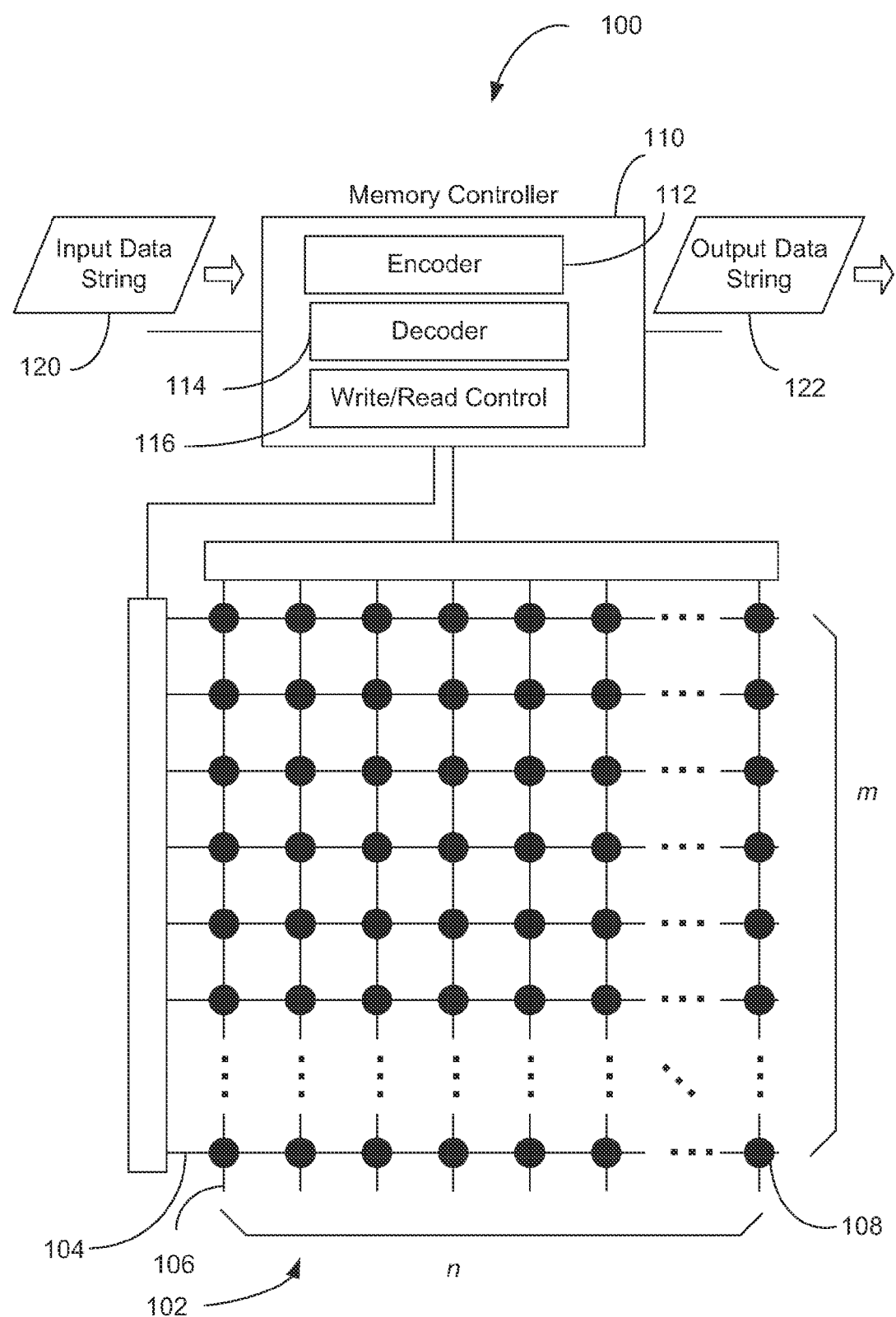
FIG. 1 is a schematic view of a data storage system in an embodiment of the invention that includes a crossbar array of resistive memory devices.

FIG. 1 shows a data storage system 100 that may implement a method for encoding data for storage in a memory array of resistive memory devices in a way that effectively limits the current draw and power consumption of write and read operations. As shown in FIG. 1, the system 100 includes an m×n memory array 102 with multiple memory devices 108, where m and n are integers. As used herein, an "m×n memory array" means that there are a first set of m conductors and a second set of n conductors in the memory array, and each of the m conductors in the first set intersects each of the n conductors in the second set once to address a memory device located at that intersection. For ease of reference, in the description below the conductors in the first set will be referred to as "row conductors," and the conductors in the second set will be referred to as "column conductors." It should be noted, however, that the terms "row" and "column" are used herein in this context mainly as labels and do not impose any particular limitations on the physical layout of the conductors in the memory array.

A simple example of an m×n array is, as shown in FIG. 1, a crossbar array that has m row wire segments 104 and n column wire segments 106 in one circuit plane. The row wire segments 104 run in one direction and intersect with the column wire segments 106 that run in another direction, with a total of nn memory devices formed at the intersections of the row and column wires segments. An embodiment of the memory devices will be described in detail later with reference to FIG. 4. It should be noted, however, that the crossbar shown in FIG. 1 is only an example of an m×n array, and there are many different ways to form such an array. For instance, the conductors and memory devices do not have to be all in the same circuit plane, and the conductors do not have to be straight wire segments and do not have to form a rectangular grid. By way of example, a 128×256 array may be formed by combining two 128×128 crossbar arrays on two circuit planes. To that end, each row wire segment of the crossbar array in the first plane may be connected by a via to a corresponding row wire segment of the crossbar array in the second plane. In that case, the two connected row wire segments and the connection via together form one "row conductor," while each column wire segment in either plane is a "column conductor" of the 128×256 memory array.

To control the operations of storing and retrieving data to and from the m×n memory array, the system includes a memory controller 110. The memory controller 110 has modules for various functions, including an encoder module 112 for data encoding, a decoding module 114 for data decoding, and a write/read control module 116 for controlling the operations of writing data to memory array 102 and reading data from the memory array. As described in greater detail below, the memory controller 110 is programmed to encode data 120 received as input, and to store the encoded data into the memory array 102. The memory controller 110 is also programmed to read out the data stored in the memory array 102, decode the data to recover the original bits in the input data 120, and transmit the decoded data as output 122 to another component.

In accordance with a feature of embodiments of the invention, the data encoding is done to ensure that the data stored in the memory array 102 meet a particular requirement such that the current draw caused by the "half-selected" memory devices in a write or read operation does not exceed a certain limit. Specifically, a Hamming-weight constraint is applied so that the number of memory devices on each row or column conductor of the array that are in the low-resistance ON (or "1") state is no more than half of the memory devices on that conductor. The term "Hamming weight" means the total number of "1" bits in a given bit string. Thus, for each row conductor in the memory array, no more than n/2 memory devices are in the ON state, and for each column conductor, not more than m/2 memory devices are in the ON state. As a result, when a memory device is addressed for a write or read operation by selecting the row and column conductors that intersect to form the memory device, there are no more than (m+n)/2 memory devices on the selected row and column conductors that are in the ON state. As the memory devices in the ON state are those that contribute to the parasitic current draw, imposing the particular Hamming-weight constraint effectively places an upper limit on the total current draw for the write or read operation.

In accordance with another feature of embodiments of the invention, the encoding of input data for storage in the memory array under the Hamming-weight constraint may be carried out by a bit-flipping operation that is very simple computationally. A method of one embodiment of the invention for data encoding and the subsequent decoding is now described with reference to FIG. 2.

Generally, the intended bit values of the memory devices in an m×n memory array may be represented by an m×n binary array A. The value (0 or 1) of an entry $A_{i,j}$ indicates the state (OFF or ON) of the memory device at the intersection of the i-th row conductor and j-th column conductor. A value of "1" means the memory device is in a low resistance state (or the ON state) and a value of "0" means the memory device is in the high resistance state (or the OFF state). The array A is used in the encoding computation by the memory controller 110, and the purpose is to convert an input string containing an arbitrary pattern of 0 and 1 bits, of a certain length L, into a two-dimensional bit pattern of dimensions m×n that meets the particular Hamming-weight constraint. Moreover, the mapping is one-to-one, so that the original input string can be recovered from the corresponding m×n array. Since many m×n binary arrays do not satisfy the Hamming-weight constraint, the requirement of a one-to-one mapping implies that we need to have m·n>L. Thus, the m·n bits in the encoded array carry enough information about the encoding process to allow reconstruction (decoding) of the original L bits of data. In the present invention, as described below, for an array A with m rows and n columns, the size of the input string is L=(m−1)(n−1). In other words, with an arbitrary string of (m−1)(n−1) bits as the input, the output of the encoding operation is an m×n array of encoded data. As the bits in the entire array A will be stored in the memory array, this means that the number of memory devices required exceeds the number of bits in the original input string. The excess number of devices is termed "redundancy." For a matrix with m rows and n columns, the redundancy is m+n−1. Compared to the m·n total number of bits in the matrix, the redundancy overhead of the encoding scheme is rather low for moderate to large values of m and n.

Figure 2:
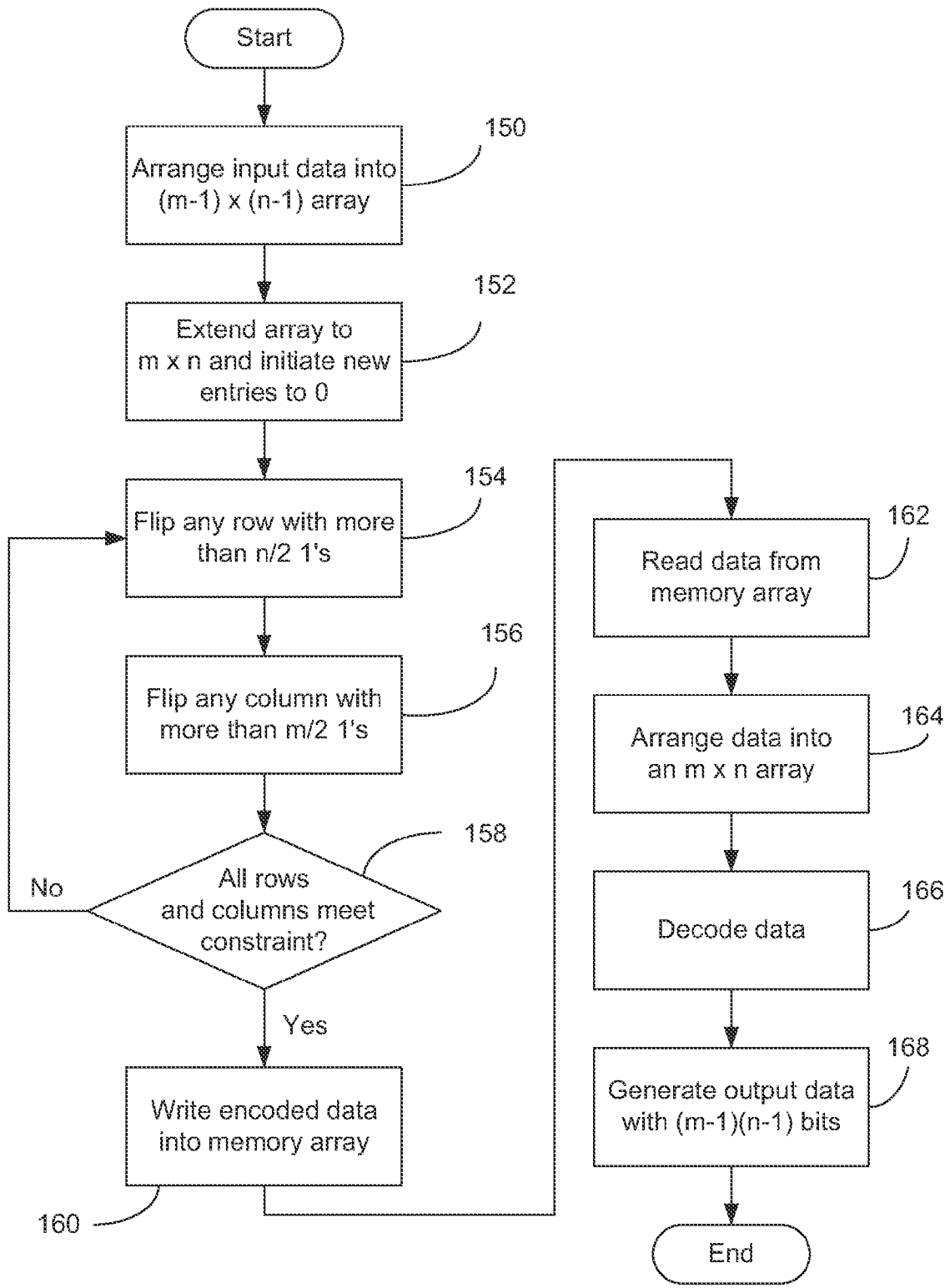
FIG. 2 is a flow chart showing a method of one embodiment of the invention for encoding data for storage in an m×n memory array under a Hamming-weight constraint, and decoding data retrieved from the memory array.

As a first step of the encoding operation, a given (m−1)(n−1) string of input bits are arranged into an (m−1)×(n−1) binary array (step 150 in FIG. 2). For instance, the first (n−1) bits of the input string may be placed in the first row of the 2-D array, and the next (n−1) bits of the input string may be placed in the second row, and so on. In a second step, this (m−1)×(n−1) array is extended into an m×n array by appending an m-th row and an n-th column, with each element in the m-th row and n-th column initialized to 0 (step 152). This m×n binary array is now denoted as A. In this regard, it should be noted that the numbering of the rows as (1, . . . , m) and the columns as (1, . . . , n) is just for labeling purposes and does not require the rows or columns to be physically in a sequential order either in a print-out of the array A on paper or as stored in the memory array.

Thereafter, a bit-flipping operation is performed iteratively on the rows and columns of the m×n array A to reduce the number of 1's in A until each of the rows and columns meets the Hamming-weight constraint of having no more than n/2 1's per row and m/2 1's per column. In one embodiment as shown in FIG. 2, the bit-flipping is first performed on the rows of A. The controller 110 finds a row that has more than n/2 1's and flips all the bits in that row (i.e., 0 to 1 and 1 to 0) (step 154). The controller 110 then sees if there is another row with more than n/2 1's and flips it if such a row is found. When there is no row that has more than n/2 1's, the controller 110 checks the columns, and bit-flips each column that has more than m/2 1's (step 156). As the flipping of columns may alter the Hamming-weights of the rows, after flipping the columns, the controller 110 checks the rows again and flips any row that has more than n/2 1's. This iterative flipping operation continues until the controller 110 determines that there is no row with more than n/2 1's and no column with more than m/2 1's (step 158). At this point, the encoding is complete, and the resultant array A is the output of the encoding process. The controller 110 then writes that bit pattern of the encoded array A into the corresponding memory devices in the memory array (step 160).

It should be noted that the flipping operation described above will terminate, i.e., the scheme is well-defined. To see this, consider that because a selected row or column for flipping has more 1's than 0's, flipping it decreases the total number of 1's in the array A by at least 1. As the array A has a finite number of elements, the decrease of 1's cannot go on forever, and the flipping operation will reach a point where no row or column violates the Hamming-weight constraint. The particular sequence in the flipping operation is not critical. For instance, the controller may be programmed to interleave the row flipping with column flipping, rather than finish flipping all the rows violating the Hamming-weight constraint first before flipping the columns. Also, the flipping of the rows or columns may be done sequentially based on the row or column numbers, or a row or column that exhibits the greatest violation of the Hamming-weight constraint may be selected for flipping first. The bits in the resultant encoded array would depend on the particular sequence of flipping in the flipping operation.

The bits stored in the memory array 102 can be read out by the controller 110 (step 162), and decoded to recover the contents of the original input string. With the encoding method described above, the decoding operation is relatively simple. The data read from the memory array are arranged into an m×n binary array. Again denoting the array as A, for i=1, 2, . . . , m−1, and j=1, 2, . . . , n−1, each entry $A_{i,j}$ is flipped if $A_{i,n}+A_{m,j}+A_{m,n}=1$ modulo 2 (i.e., the sum is odd), and is left unchanged otherwise (step 166). This operation is equivalent to updating $A_{i,j}$ to $(A_{i,j}+A_{i,n}+A_{m,j}+A_{m,n})$ modulo 2. After the entries in the array A are modified in this way, the bits in the (m−1)×(n−1) sub-array of A (consisting of entries $A_{i,j}$ for i=1, 2, . . . , m−1, and j=1, 2, . . . , n−1) are put into a string of (m−1)(n−1) bits that is identical to the original input string (step 168). This reconstructed string may then be sent by the controller as an output.

To show why the decoding operation described above works, let $p_{i,j}$, $p_{i,n}$, $p_{m,j}$ and $p_{m,n}$ denote respectively the number of times modulo 2 (i.e., 0 if even, 1 if odd) the bits (i,j), (i,n), (m,j) and (m,n) are flipped during the encoding operation. Note that since the latter three were initialized to 0 prior to flipping, $p_{i,n}$, $p_{m,j}$, $p_{m,n}$ coincide respectively with the final encoded bits $A_{i,n}$, $A_{m,j}$, $A_{m,n}$. The decoding works because $p_{i,j}+p_{i,n}+p_{m,j}+p_{m,n}$ modulo $2=0$, regardless of the sequence of flips that may have occurred during the encoding. To see this, note that if any one of the bits is flipped in a row or column flipping step, precisely one of the three other bits is also flipped in the same step for being in the same row or column. Thus, the total number of flips among the four bits increases by 2 for each row or column flip during the encoding. As the initial number of flips is 0, at the end of the encoding operation the total number remains an even number, so $p_{i,j}+p_{i,n}+p_{m,j}+p_{m,n}$ modulo $2=0$ holds. This equation can be rewritten to be $p_{i,j}+p_{i,n}+p_{m,j}+p_{m,n}$ modulo 2, which means that the bit (i,j) is flipped an odd number of times during encoding if and only if $p_{i,n}+p_{m,j}+p_{m,n}$ modulo $2=A_{i,n}+A_{m,j}+A_{m,n}$ modulo $2=1$, which is the condition for flipping the bit (i,j) in the decoding operation described above.

Figure 3:
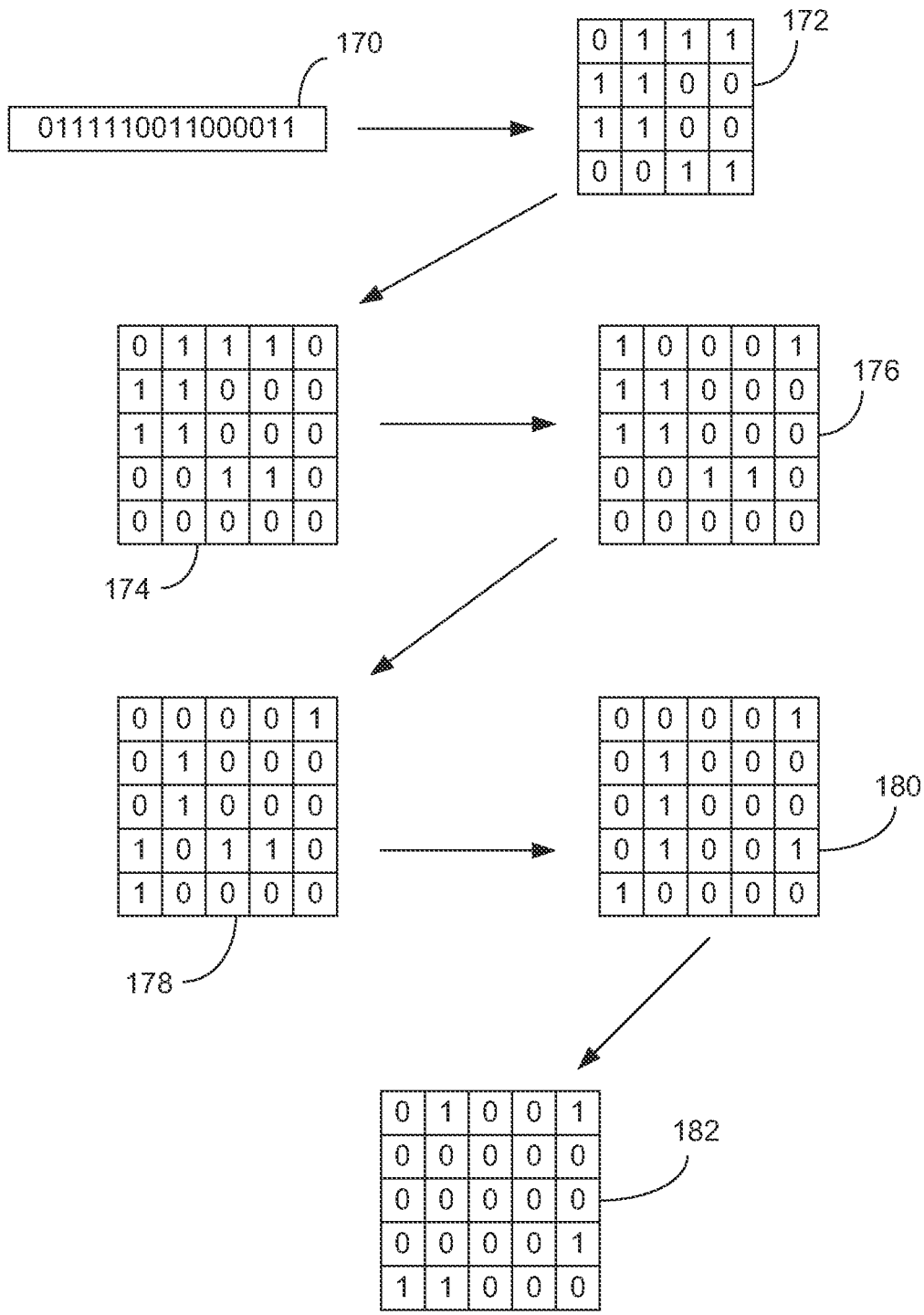
FIG. 3 shows, as an example, the evolution of bits in a data array during an encoding operation according to the method of FIG. 2.

By way of example, FIG. 3 shows how the encoding method described above is applied to a given string of bits. For simplicity and clarity of illustration, a relatively small string 170 of data bits is used in this example. Also, a square data matrix, instead of a rectangular data matrix, is used in the example, although it should be clear that the encoding method applies equally well to rectangular memory arrays. In the example, the original input data string has 16 bits: 0111110011000011. The 16 bits are arranged into a 4×4 matrix 172. This matrix 172 is then extended into a 5×5 matrix, by appending a $5^{th}$ row and a $5^{th}$ column, both initialized to 0. For clarity of description, each different state or bit pattern of this 5×5 matrix is identified by a reference numeral. In this example, with a total of 5 rows and 5 columns in the matrix, the Hamming-weight constraint is that there should be no more than two 1's in each row or column. As shown in FIG. 3, the first row of the bit pattern 174 is found to have three 1's and thus violates the constraint. As a result, row 1 is selected for flipping, and the flipping results in the bit pattern 176. Thereafter, as shown in FIG. 3, column 1 of the bit pattern 176 is found to have too many 1's and is flipped, resulting in the bit pattern 178. Due to the column flipping, row 4 of the bit pattern 178 now has three 1's and is flipped. The flipping causes column 2 of the resultant bit pattern 180 to have too many 1's so that column is flipped. The resultant bit pattern 182 now meets the Hamming weight constraint of no more than two 1's in any row or column, so the encoding is complete. The values of the bits in this final encoded bit pattern 182 can then be written into the corresponding memory devices in a 5×5 memory array (or a 5×5 portion of a larger memory array).

Figure 4:
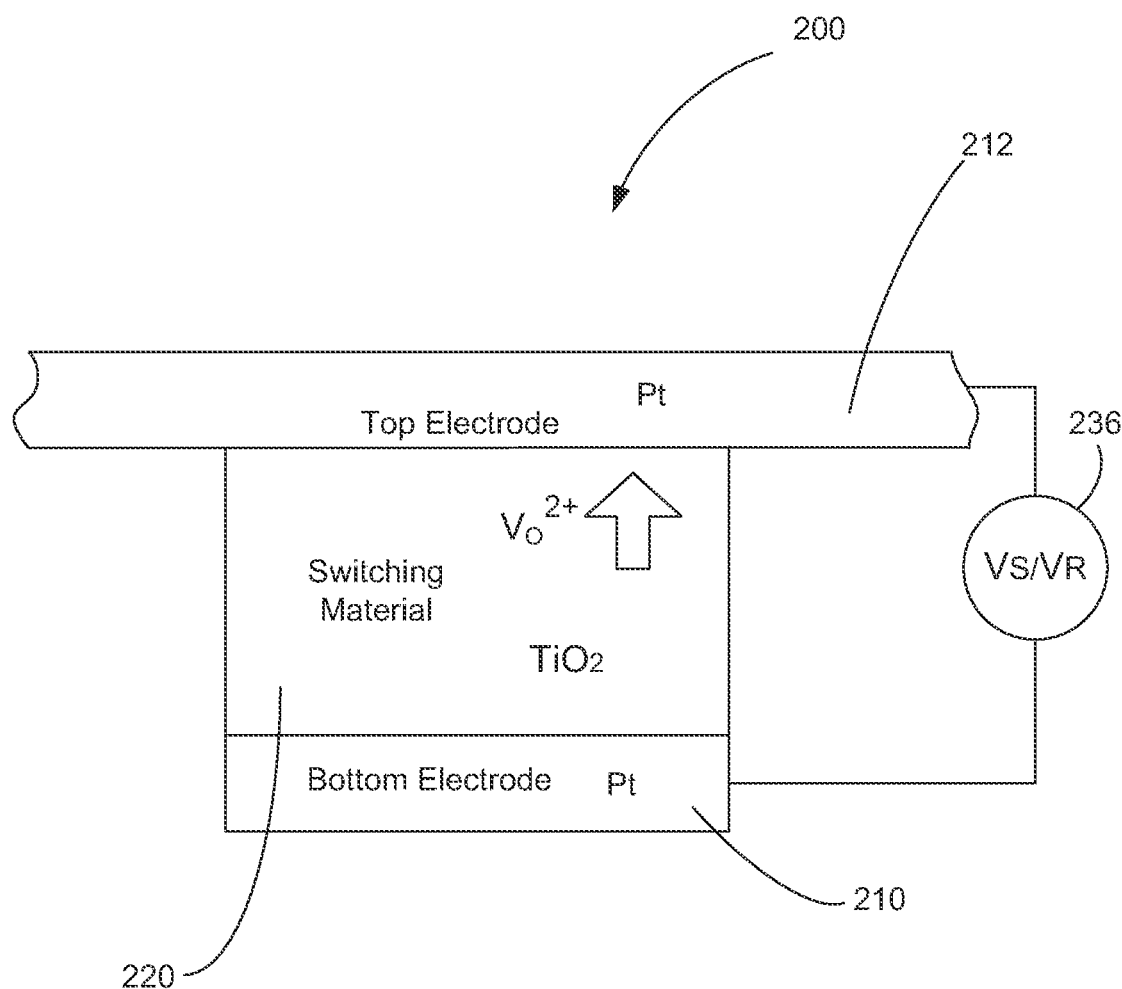
FIG. 4 is a schematic cross-sectional view of a resistive switching device that may be used as memory devices in a memory array in an embodiment of the invention.

As mentioned above, in some embodiments, the memory devices 108 in the memory array 102 may be resistive switching devices formed at the intersections of the row and column conductors of the memory array. FIG. 4 shows an example of a resistive switching device 200 in the form of a crosspoint device. The resistive switching device comprises a bottom electrode 210 and a top electrode 212 extending over the bottom electrode. Disposed between the top and bottom electrode 212 and 210 is an active region 220 that exhibits the resistive switching behavior. The top electrode 212 may be, for example, a part of a column wire segment 106 in the crossbar shown in FIG. 1, and the bottom electrode 210 may be a portion of a row wire segment 104. The electrodes 210 and 212 are formed of a conductive material, which may be a metal such as platinum, gold, copper, tantalum, tungsten, etc., or doped semiconductor materials.

The active region 220 disposed between the top electrode 212 and bottom electrode 210 contains a switching material. The switching material is capable of carrying a species of mobile ionic dopants such that the dopants can be controllably transported through the switching material and redistributed over the active region 220. The redistribution of the dopants changes the electrical properties of either the switching material or the interface of the switching material and an electrode, which in the illustrated example of FIG. 4 may be the top electrode 212. This ability to change the electrical properties as a function of dopant distribution allows the switching device 200 to be placed in different resistance states by applying a voltage from a voltage source 236 to the electrodes 210 and 212. Switching devices of this type have been identified as forms of "memristors."

Generally, the switching material may be electronically semiconducting or nominally insulating and a weak ionic conductor. Many different materials with their respective suitable dopants can be used as the switching material. Materials that exhibit suitable properties for resistive switching include oxides, sulfides, selenides, nitrides, carbides, phosphides, arsenides, chlorides, and bromides of transition and rare earth metals. Suitable switching materials also include elemental semiconductors such as Si and Ge, and compound semiconductors such as III-V and II-VI compound semiconductors. The III-V semiconductors include, for instance, BN, BP, BSb, AlP, AlSb, GaAs, GaP, GaN, InN, InP, InAs, and InSb, and ternary and quaternary compounds. The II-VI compound semiconductors include, for instance, CdSe, CdS, CdTe, ZnSe, ZnS, ZnO, and ternary compounds. These listings of possible switching materials are not exhaustive and do not restrict the scope of the present invention.

The dopant species used to alter the electrical properties of the switching material depends on the particular type of switching material chosen, and may be cations, anions or vacancies, or impurities as electron donors or acceptors. For instance, in the case of a transition metal oxide such as $TiO_2$, the dopant species may be oxygen vacancies ($V_O^{2+}$). For GaN, the dopant species may be nitride vacancies or sulfide ion dopants. For compound semiconductors, the dopants may be n-type or p-type impurities.

By way of example, as illustrated in FIG. 4, the switching material may be $TiO_2$, and the dopants may be oxygen vacancies ($V_O^{2+}$). Initially, there may be an asymmetry in the dopant distribution. For example, the dopant concentration may have a gradient across the active region 220, being higher around the bottom electrode 210 and substantially lower around the top electrode 212. In this regard, in some embodiments, a region (e.g., adjacent the bottom electrode 210) may be formed to have a high concentration of dopants to serve as a reservoir of dopants that can be redistributed over the active region during a switching operation. When a DC switching voltage from the voltage source 236 is applied to the top and bottom electrodes 212 and 210, an electrical field is created across the active region 220. This electric field, if of sufficient strength and proper polarity, may drive the oxygen vacancies to drift through the switching material in the active region 220 towards the top electrode 212, thereby turning the device into an ON state that has a low resistance.

If the polarity of the electrical field is reversed, the oxygen vacancies may drift in an opposite direction across the active region 220 and away from the top electrode 212, thereby turning the device into an OFF state with a high resistance. In this way, the switching is reversible and may be repeated. Moreover, the switching device 200 may be put in an intermediate state with a resistance value between the ON an OFF resistance values. Due to the relatively large electrical field needed to cause dopant drifting, after the switching voltage is removed, the locations of the dopants remain stable in the switching material. In other words, the switching may be non-volatile. The state of the switching device 200 may be read by applying a read voltage from the voltage source 236 to the top and bottom electrodes 212 and 210 to sense the resistance across these two electrodes. The read voltage is typically much lower than the switching voltage required to cause drifting of the ionic dopants in the active region 220, so that the read operation does not alter the ON/OFF (or intermediate) state of the switching device.

In the encoding method of FIG. 2, bit-flipping of rows and columns are used to generate a 2-D binary array that meets the Hamming-weight constraint, and that binary array has a row and a column that were appended to it for tracking the number of times (modulo 2) each data bit in the matrix has been flipped in the encoding process. Two variations on the above encoding scheme may be used respectively when m and n are both even and when m and n are both odd. As described in greater detail below, both variations, like the method of FIG. 2, involve row and column flipping and the use of added row and column for tracking the number (modulo 2) of flipping.

In the first variation, m and n are both even. The input is an arbitrary string of $(m-1)(n-1)$ bits, and the output is an m×n array with at most n/2 1's in each row and at most m/2 1's in each column. The input bits are first arranged into an $(m-1)(n-1)$ binary array A'. Thereafter, a flipping operation is applied to A'. Any row that has more than $(n-1)/2$ 1's or any column that has more than $(m-1)/2$ 1's is flipped. The flipping is iterated until there is no row or column in A' that violates the Hamming-weight constraint. Thereafter, the matrix A' is extended into an m×n array A by adding the m-th row and n-th column. If row i was flipped an odd number of times, $A_{i,n}$ is set to 1, otherwise $A_{i,n}$ is set to zero. If column j was flipped an odd number of times, $A_{m,j}$ is set to 1, otherwise $A_{m,j}$ is set to 0. Thereafter, if the partial row $[A_{m,1}, \ldots, A_{m,n-1}]$ has more than $(n-1)/2$ 1's all bits of $[A_{m,1}, \ldots, A_{m,n-1}]$ and $[A_{1,n}, \ldots A_{m-1,n}]$ are flipped. Afterwards, if the partial column $[A_{1,n}, \ldots, A_{m-1,n}]$ has more than $(m-1)/2$ 1's then all bits in $[A_{1,n}, \ldots, A_{m-1,n}]$ are flipped, and $A_{m,n}$ is set to 1. Otherwise A, is set to 0. At this point, the encoding is complete, and the resultant matrix A can be written into the memory array. The decoder for this encoding scheme is the same as the one described earlier for the encoding scheme of FIG. 2.

Another variation of the flipping method may be applied when both m and n are odd. Again, the input is an arbitrary string of $(m-1)(n-1)$ bits, and the output is an m×n array A with at most n/2 1's in each row and at most m/2 1's in each column. The $(m-1)(n-1)$ input bits are first arranged into an $(m-1)\times(n-1)$ binary array A'. This array is then extended to form the array A by appending an m-th row and an n-th column. Instead of initiating the entries in the added row and column to 0, for each row i the entry $A_{i,n}$ is set to $\Sigma_{j=1}^{n-1} A_{i,j}$ modulo 2, and for each column j the entry $A_{m,j}$ is set to $\Sigma_{i=1}^{m-1} A_{i,j}$ modulo 2. The corner entry $A_{m,n}$ is set to $\Sigma_{i=1}^{m-1} A_{i,n}$ modulo 2. After the m×n binary array A is formed, a bit-flipping operation is applied iteratively to any row that has more than n/2 1's and any column that has more than m/2 1's until no such row or column exists. At that point, the encoding is complete, and the contents of the matrix A may be stored in the corresponding locations in the memory array.

To decode the contents of A, for i=1, 2, . . . , m, set a variable $r_i = \Sigma_{j=1}^{n} A_{i,j}$. For j=1, 2, . . . , n, set another variable $c_j = \Sigma_{i=1}^{m} A_{i,j}$. Another variable N is set to $\Sigma_{i=1}^{m} \Sigma_{j=1}^{n} A_{i,j}$. Then for i=1, 2, . . . , m-1 and j=1, 2, . . . , n-1, the entry $A_{i,j}$ is flipped if $r_i + c_j + N = 1$ modulo 2 (i.e., the sum is odd), or left unchanged if otherwise. This is equivalent to updating $A_{i,j}$ to $A_{i,j} + r_i + c_j + N$ modulo 2. The updated entries $A_{i,j}$ in the $(m-1)\times(n-1)$ sub-array of A are then arranged into a string of $(m-1)(n-1)$ bits as the output of the decoding operation.

Figure 5:
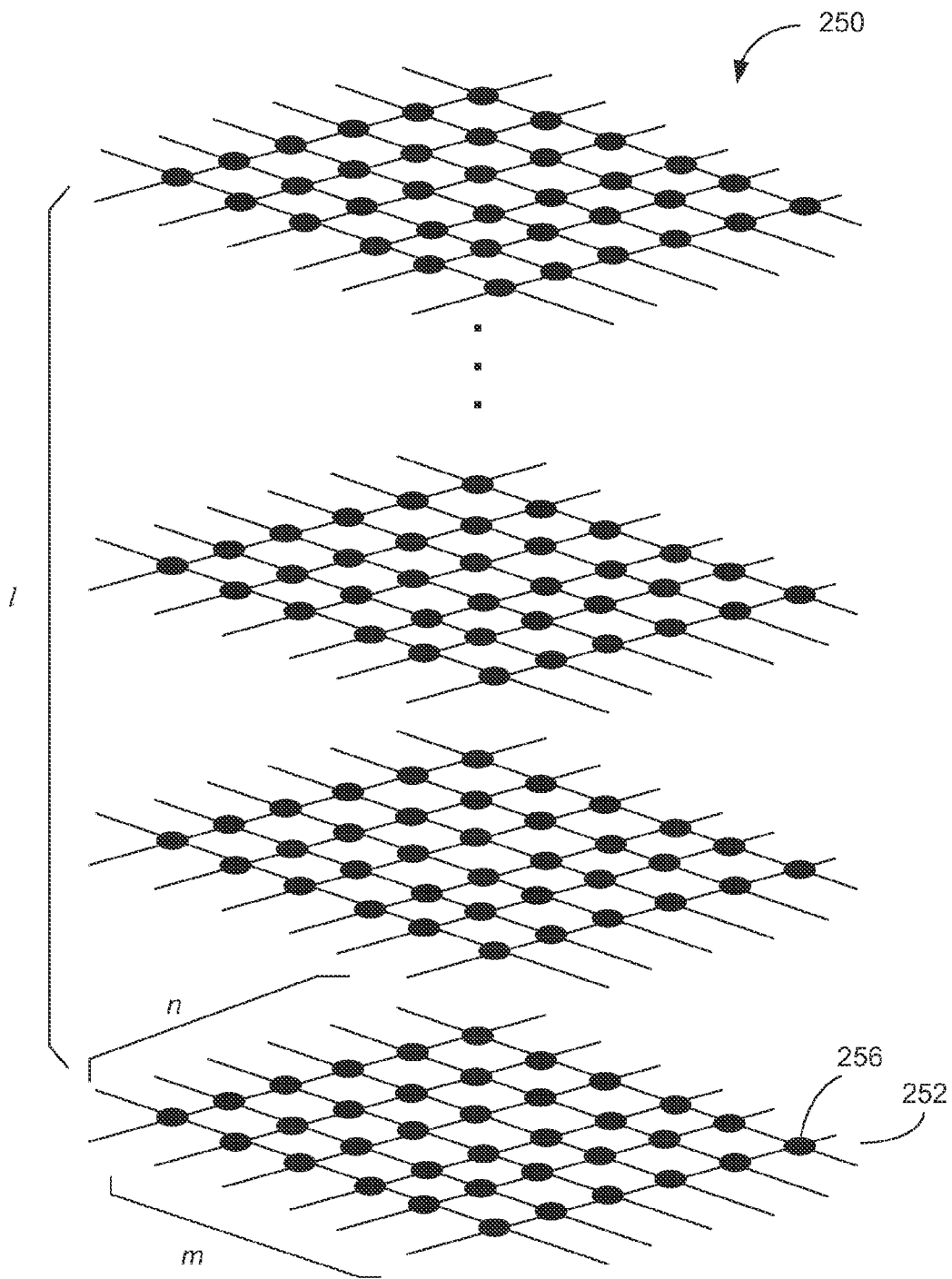
FIG. 5 is a schematic view of a 3-dimensional memory array for which a method of an embodiment of the invention may be used for encoding input data under a Hamming-weight constraint for storage in the memory array.

The flipping encoders and the corresponding decoders may be readily extended to higher dimensional memory structures with one-dimensional (or higher) Hamming-weight constraints. For example, FIG. 5 shows a 3-D structure of memory devices. The memory structure 250 has/layers, and each layer has a crossbar structure 252 of m row wire segments and n column wire segments. Each memory device 256 in the memory structure may be individually turned ON (i.e., the "1" state) and OFF (i.e., the "0" state). Thus, the 3-D memory structure 250 corresponds to an l×m×n binary array A, the entries of which are denoted by $A_{h,i,j}$, where h, i, and j take values in the respective index sets {1, 2, . . . , l}, {1, 2, . . . , m}, and {1, 2, . . . , n}. The notation $A_{h,i,*}$, $A_{h,*,j}$, and $A_{*,i,j}$ are used to denote respectively the one-dimensional groups of entries or generalized rows $\{A_{h,i,1}, A_{h,i,2}, \ldots, A_{h,i,n}\}$, $\{A_{h,1,j}, A_{h,2,j}, \ldots, A_{h,m,j}\}$, and $\{A_{1,i,j}, A_{2,i,j}, A_{1,i,j}\}$. Similarly, the notation $A_{h,*,*}$, $A_{*,i,*}$, and $A_{*,*,j}$ denote 2-D slices of the array A where the respective entries are obtained by replacing the *'s with all possible values for those coordinates.

The Hamming-weight constraint can be applied to the generalized rows $A_{h,i,*}$, $A_{h,*,j}$, and $A_{*,i,j}$, for all values of h, i, j to have respective Hamming weights no more than n/2, m/2, and l/2. The encoding method of FIG. 2 described above can be applied in a generalized manner. First, an input string of length $(l-1)(m-1)(n-1)$ is arranged into an $(l-1)\times(m-1)\times(n-1)$ 3-D matrix (comprised of entries $A_{h,i,j}$ with h=1, . . . , l-1, i=1, . . . , m-1, j=1, . . . , n-1). This matrix is then extended into an l×m×n 3-D array, denoted A, by adding the border planes $A_{l,*,*}$, $A_{*,m,*}$, and $A_{*,*,n}$. All the entries in these border planes are initialized to 0. A flipping operation is then performed iteratively, where all entries in any generalized 1-D row $A_{h,i,*}$, $A_{h,*,j}$, and $A_{*,i,j}$, violating the constraint are flipped in one iteration of this step. As explained earlier, the flipping process is guaranteed to terminate. The encoded 3-D array A can then be written into the corresponding 3-D memory array The decoding operation for the 3-D array is similar to that for a 2-D array described earlier with reference to FIG. 2, but generalized for the 3-D case. The main step of decoding is replaced by the update of $A_{h,i,j}$ for h≤l-1, i≤m-1, j≤n-1 to the modulo 2 sum $A_{h,i,j} + A_{l,i,j} + A_{h,m,j} + A_{h,i,n} + A_{h,m,n} + A_{l,i,n} + A_{l,m,j} + A_{l,m,n}$. The entries in the $(l-1)\times(m-1)\times(n-1)$ sub-array of A may then be arranged into a string of length $(l-1)(m-1)(n-1)$ for output.

In the foregoing description, numerous details are set forth to provide an understanding of the present invention. However, it will be understood by those skilled in the art that the present invention may be practiced without these details. While the invention has been disclosed with respect to a limited number of embodiments, those skilled in the art will appreciate numerous modifications and variations thereof. It is intended that the appended claims cover such modifications and variations as fall within the true spirit and scope of the invention.

What is claimed is:

1. A method of storing data into a memory array having multiple memory devices, comprising:
   converting an input string into a first binary array with (m-1) rows and (n-1) columns;
   generating from the first binary array a second binary array with m rows and n columns and in an encoded bit pattern, wherein the second binary array in the encoded bit pattern has at most n/2 1's in each row and at most m/2 1's in each column, and wherein an m-th row and an n-th column of the second binary array in the encoded bit pattern contain information for decoding other entries of the second binary array; and storing the encoded bit pattern of the second binary array into corresponding memory devices of the memory array.

2. A method as in claim 1, wherein the step of generating includes:

appending the m-th row and the n-th column to the first binary array to form the second binary array with m rows and n columns, entries in the m-th row and n-th column being initialized to 0;

iteratively bit-flipping any row of the second binary array with more than n/2 1's and any column with more than m/2 1's until no such row or column remains.

3. A method as in claim 1, wherein both m and n are even, and the step of generating includes:

iteratively bit-flipping any row of the first binary array with more than (n−1)/2 1's and any column with more than (m−1)/2 1's until no such row or column remains;

appending the m-th row and n-th column to the first binary array after the iterative bit-flipping; and initializing entries in the m-th row and n-th column based on whether a corresponding row or column of the first binary array is bit-flipped an even or odd number of times.

4. A method as in claim 1, wherein both m and n are odd, and the step of generating includes:

appending the m-th row and n-th column to the first binary array;

initializing entries of the m-th row and the n-th columns based on sums of entries in corresponding rows and columns of the first binary array; and iteratively bit-flipping any row of the second binary array with more than n/2 1's and any column with more than m/2 1's until no such row or column remains.

5. A method as in claim 1, wherein the memory devices of the memory array are resistive switching devices, each resistive switching device being capable of switching to an ON state with a low resistance and to an OFF state with a high resistance.

6. A method as in claim 5, wherein each resistive switching device has first and second electrodes and an active region disposed between the first and second electrodes, the action region containing a switching material capable of carrying a species of dopants and transporting the dopants under an electrical field to change a resistance of the resistive switching device.

7. A system for storing data, comprising:

an m×n memory array;

a memory controller for controlling data storage in the memory array, the memory controller being programmed to perform steps of converting an input string into a first binary array with (m−1) rows and (n−1) columns, generating from the first binary array a second binary array with m rows and n columns and in an encoded bit pattern, wherein the second binary array in the encoded bit pattern has at most n/2 1's in each row and at most m/2 1's in each column, and wherein an m-th row and an n-th column of the second binary array in the encoded bit pattern contain information for decoding other entries of the second binary array, and storing the encoded bit pattern of the second binary array into corresponding memory devices of the memory array.

8. A system as in claim 7, wherein the step of encoding performed by the storage controller includes:

adding the m-th row and the n-th column to the first binary array to form the second binary array with m rows and n columns, entries in the m-th row and n-th column being initialized to 0;

iteratively bit-flipping any row of the second binary array with more than n/2 1's and any column with more than m/2 1's until no such row or column remains.

9. A system as in claim 7, wherein both m and n are even, and wherein the step of generating performed by the memory controller includes:

iteratively bit-flipping any row of the first binary array with more than (n−1)/2 1's and any column with more than (m−1)/2 1's until no such row or column remains;

appending the m-th row and n-th column to the first binary array after the iterative bit-flipping; and initializing entries in the m-th row and n-th column based on whether a corresponding row or column of the first binary array is bit-flipped an even or odd number of times.

10. A system as in claim 7, wherein both m and n are odd, and wherein the step of generating performed by the memory controller includes:

appending the m-th row and n-th column to the first binary array;

initializing entries of the m-th row and the n-th columns based on sums of entries in corresponding rows and columns of the first binary array; and iteratively bit-flipping any row of the second binary array with more than n/2 1's and any column with more than m/2 1's until no such row or column remains.

11. A system as in claim 7, wherein the memory devices of the memory array are resistive switching devices, each resistive switching device being capable of switching to an ON state with a low resistance and to an OFF state with a high resistance.

12. A system as in claim 11, wherein each resistive switching device has first and second electrodes and an active region disposed between the first and second electrodes, the action region containing a switching material capable of carrying a species of dopants and transporting the dopants under an electrical field to change a resistance of the resistive switching device.

13. A system as in claim 12, wherein the switching material is a metal oxide.

14. A method of retrieving data stored in a memory array having multiple memory devices, comprising:

reading data of a binary array with m rows and n columns from corresponding memory devices of the memory array, the data of the binary array being in an encoded form such that there are at most n/2 1's in each row and at most m/2 1's in each column;

converting data in the binary array into a decoded form using encoding information stored in an m-th row and an n-th column of the binary array; and placing data of an (m−1)×(n−1) sub-array of the binary array in the decoded form into a data string; and outputting the data string.

15. A method as in claim 14, wherein the step of converting includes updating $A_{i,j}$ to $(A_{i,j}+A_{i,n}+A_{m,j}+A_{m,n})$ modulo 2, wherein $A_{i,j}$, $A_{i,n}$, $A_{m,j}$, and $A_{m,n}$ are respective entries of the binary array.

* * * * *